(12) United States Patent
Okamura et al.

(10) Patent No.: US 11,683,993 B2
(45) Date of Patent: Jun. 20, 2023

(54) MATERIAL HAVING BOTH NEGATIVE SPIN POLARIZATION AND NEGATIVE ANISOTROPY

(71) Applicant: Western Digital Technologies, Inc., San Jose, CA (US)

(72) Inventors: Susumu Okamura, Fujisawa (JP); Christian Kaiser, San Jose, CA (US); James Mac Freitag, Sunnyvale, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 289 days.

(21) Appl. No.: 17/210,073

(22) Filed: Mar. 23, 2021

(65) Prior Publication Data
US 2022/0310900 A1   Sep. 29, 2022

(51) Int. Cl.
*H10N 50/80* (2023.01)
*G11B 5/21* (2006.01)
(Continued)

(52) U.S. Cl.
CPC .......... *H10N 50/80* (2023.02); *G01R 33/093* (2013.01); *G11B 5/21* (2013.01); *G11C 11/161* (2013.01);
(Continued)

(58) Field of Classification Search
None
See application file for complete search history.

(56) References Cited

U.S. PATENT DOCUMENTS 9,666,216 B1   5/2017  Kobayashi et al.
10,762,919 B1 * 9/2020  Song ........................ G11B 5/11
(Continued)

FOREIGN PATENT DOCUMENTS

| CN | 106022345 A | 10/2016 |
| JP | 2018133119 A | 8/2018 |
| WO | 2015126326 A1 | 8/2015 |

OTHER PUBLICATIONS

Brussing, F., et al., "Magnetization reversal and magnetic interactions in patterned spin valve structures", Journal of Physics D: Applied Physics, vol. 42, No. 16, pp. 1-9 (Jul. 31, 2009).
(Continued)

*Primary Examiner* — Kevin M Bernatz
(74) *Attorney, Agent, or Firm* — Patterson + Sheridan, LLP; Steven H. Ver Steeg

(57) ABSTRACT

Aspects of the present disclosure generally relate to a spintronic device for use in a magnetic media drive, a magnetoresistive random access memory device, a magnetic sensor, or a magnetic recording write head. The spintronic device comprises a multilayer structure having a negative anisotropic field and a negative spin polarization. The multilayer structure comprises a plurality of layers, each layer of the plurality of layers comprising a first sublayer comprising Fe and a second sublayer comprising Co. At least one of the first sublayer and the second sublayer comprises one or more of Cr, V, and Ti. The first and second sublayers are alternating. The negative anisotropic field of the multilayer structure is between about −0.5 T to about −0.8 T, and an effective magnetization of the multilayer structure is between about 2.4 T to about 2.8 T.

26 Claims, 10 Drawing Sheets

(51) Int. Cl.

| | |
|---|---|
| *H10B 61/00* | (2023.01) |
| *H10N 50/85* | (2023.01) |
| *H01F 10/32* | (2006.01) |
| *H10N 50/10* | (2023.01) |
| *G01R 33/09* | (2006.01) |
| *G11C 11/16* | (2006.01) |

(52) U.S. Cl.
CPC ....... *H01F 10/325* (2013.01); *H01F 10/3295* (2013.01); *H10B 61/00* (2023.02); *H10N 50/10* (2023.02); *H10N 50/85* (2023.02)

(56) References Cited

U.S. PATENT DOCUMENTS

| | | | |
|---|---|---|---|
| 10,797,227 | B2 | 10/2020 | Le et al. |
| 11,289,118 | B1* | 3/2022 | Kaiser .................. G11B 5/313 |
| 11,393,493 | B1* | 7/2022 | Nakagawa ............ G11B 5/193 |
| 2006/0255383 | A1* | 11/2006 | Kaiser .................. H10N 50/10 257/295 |
| 2018/0261241 | A1* | 9/2018 | Narita .................. G11B 5/312 |
| 2021/0375309 | A1* | 12/2021 | Iwasaki ............... G11B 5/3153 |
| 2022/0157335 | A1* | 5/2022 | Iwasaki ................ G11B 5/23 |
| 2022/0383898 | A1* | 12/2022 | Nakagawa ........... G11B 5/23 |

OTHER PUBLICATIONS

Hirohata, A., et al., "Magnetic Properties of Epitaxial Co2Cr1-xFexAl Full Heusler Alloy Thin Films With the L21 Structure", IEEE Transactions on Magnetics, vol. 41, No. 10, pp. 2802-2804 (Oct. 2005).

Takata, Fumiya et al., "Negative anisotropic magnetoresistance resulting from minority spin transport in NixFe4-xN (x=1 and 3) epitaxial films", Journal of Applied Physics, 2017, vol. 121, Issue 2, pp. 023903-1 to 023903-5.

Yoshida, Kazuetsu et al., "Spin Torque Oscillator With Negative Magnetic Anisotropy Materials for MAMR", IEEE Transactions on Magnetics, vol. 46, No. 6, Jun. 2010, pp. 2466-2469.

Chung, H. J. et al., "Co/Fe multilayers with ultra-low damping and large negative anisotropy as the free layer for spin torque oscillator", Applied Physics Letters, vol. 109, Issue 18, 2016, pp. 182401-1 to 182401-5.

Oogane, Mikihiko et al., "Low magnetic damping and large negative anisotropic magnetoresistance in halfmetallic Co2-xMn1+xSi Heusler alloy films grown by molecular beam epitaxy", Applied Phyiscs Letters, vol. 112, Issue 26, 2018, pp. 262407-1 to 262407-5.

Zhang, Mingsheng et al., "Analysis of Switchable Spin Torque Oscillator for Microwave Assisted Magnetic Recording", Advances in Condensed Matter Physics, vol. 2015, Mar. 2015, pp. 1-8.

* cited by examiner

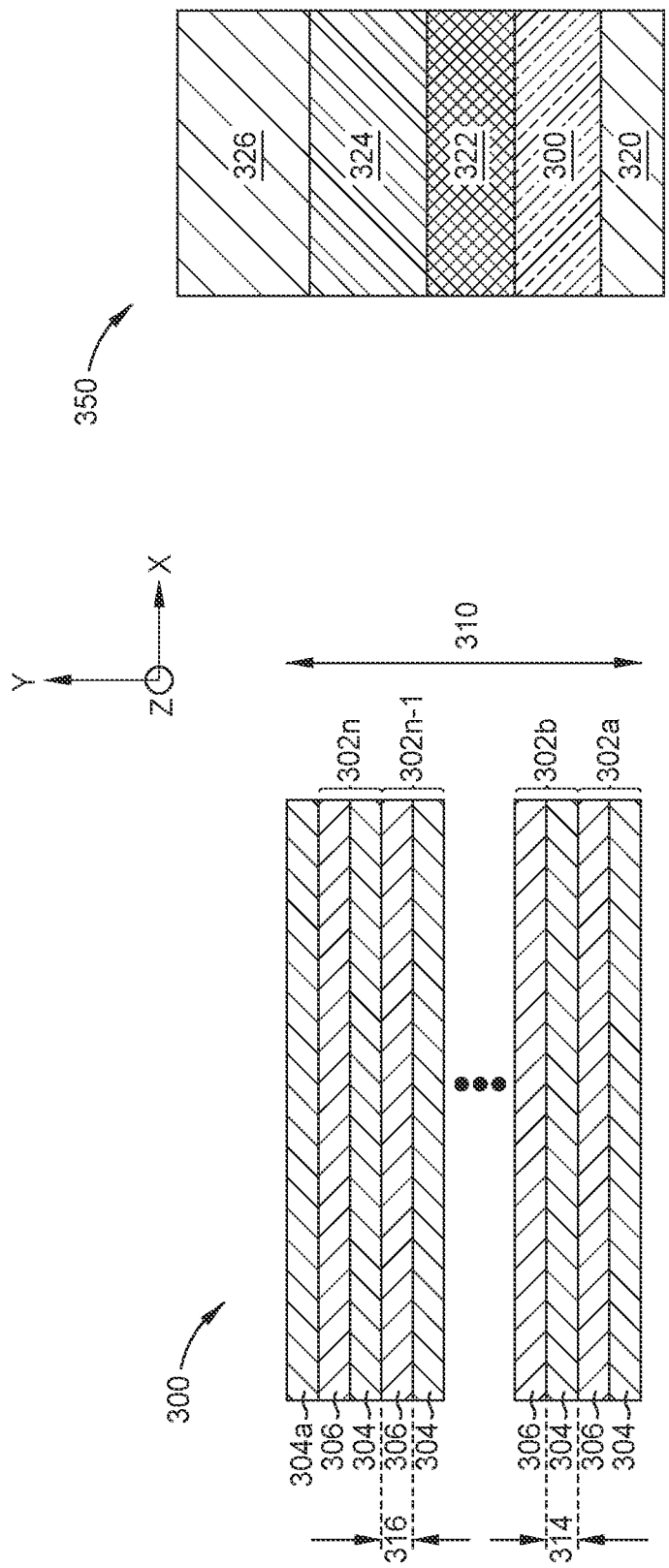

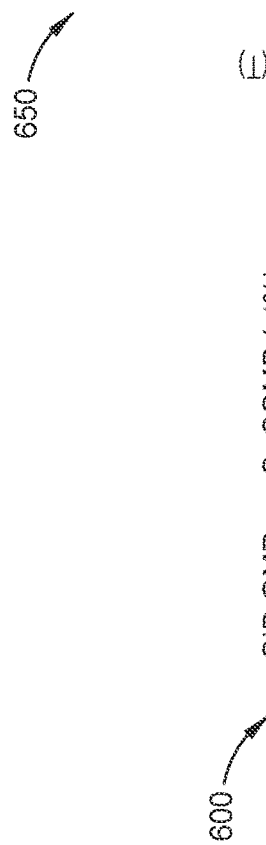
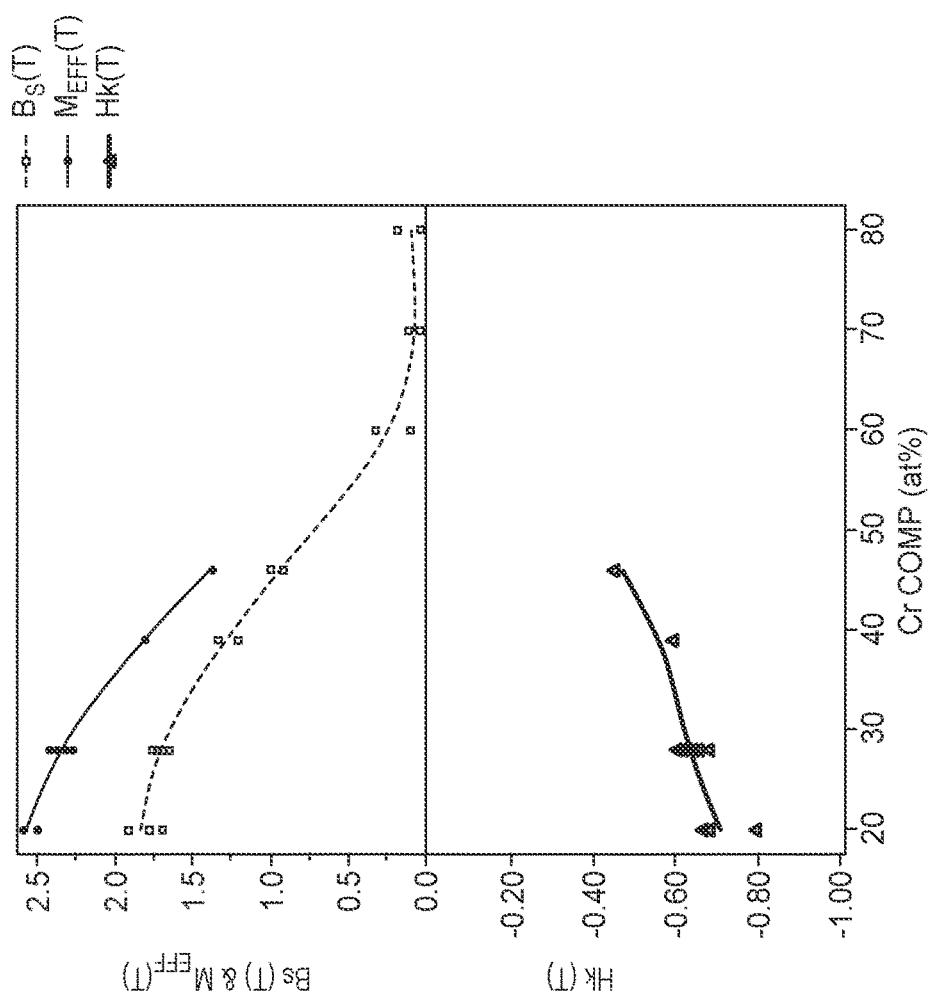
FIG. 6B
FIG. 6A

US 11,683,993 B2

MATERIAL HAVING BOTH NEGATIVE SPIN POLARIZATION AND NEGATIVE ANISOTROPY

BACKGROUND OF THE DISCLOSURE

Field of the Disclosure

Embodiments of the present disclosure generally relate to a multilayer material having negative spin polarization and negative anisotropy for use in spintronic devices.

Description of the Related Art

In spin electronic devices or spintronic devices, such as sensors utilized in magnetic recording heads, both spin polarization and anisotropic field play important roles. For example, such spintronic devices may be used in spin-orbit torque (SOT) magnetic tunnel junction (MTJ) applications, such as for a spin Hall layer for energy-assisted magnetic recording write heads and magnetoresistive random access memory (MRAM) devices. Materials utilized in these spintronic devices typically have (1) a positive spin polarization with no anisotropic field, such as CoFe, Co, Ni, and CoMnGe, (2) a positive spin polarization and a negative anisotropic field, such as CoFe multilayer structures, (3) a negative spin polarization with no anisotropic field, such as FeCr, FeV, and FeN, or (4) both a positive spin polarization and a positive anisotropic field, such as CoNi, CoPt, CoPd, and $Mn_3Ga$. Because there are no materials reported to have a negative spin polarization with a negative anisotropic field, the spintronic devices generally have less freedom and are more restricted.

Therefore, there is a need in the art for a material having both a negative spin polarization and a negative anisotropic field for use in spintronic devices.

SUMMARY OF THE DISCLOSURE

Aspects of the present disclosure generally relate to a spintronic device for use in a magnetic media drive, a magnetoresistive random access memory device, a magnetic sensor, or a magnetic recording write head. The spintronic device comprises a multilayer structure having a negative spin polarization and a negative anisotropic field. The multilayer structure comprises a plurality of layers, each layer of the plurality of layers comprising a first sublayer comprising Fe and a second sublayer comprising Co. At least one of the first sublayer and the second sublayer comprises one or more of Cr, V, and Ti. The first and second sublayers are alternating. The negative anisotropic field of the multilayer structure is between about −0.5 T to about −0.8 T, and an effective magnetization of the multilayer structure is between about 2.4 T to about 2.8 T.

In one embodiment, a spintronic device comprises a multilayer structure having a negative spin polarization and a negative anisotropic field, the multilayer structure comprising a plurality of layers, each layer of the plurality of layers comprising a first sublayer comprising Fe and a second sublayer comprising Co, wherein at least one of the first sublayer and the second sublayer further comprise one or more of Cr, V, and Ti. The first and second sublayers are alternating.

In another embodiment, a spintronic device comprises a substrate and a multilayer structure having a negative spin polarization and a negative anisotropic field disposed over the substrate, the multilayer structure comprising a plurality of alternating first layers and second layers. Each of the first layers comprises Fe and one or more of Cr, V, and Ti, and each of the second layers comprises Co. Each of the first layers has a first thickness greater than or equal to a second thickness of each of the second layers. The spintronic device further comprises a cap layer disposed over the multilayer structure.

In yet another embodiment, a spintronic device comprises a multilayer structure having a negative spin polarization and a negative anisotropic field, the multilayer structure comprising a plurality of alternating first layers and second layers. Each of the first layers comprises at least one of $FeCr_x$, $FeV_x$, $FeTi_x$, $FeCr_xV_y$, $FeCr_xTi_y$, $FeV_xTi_y$, and $FeCr_xV_yTi_z$, where each of x, y, and z is a positive number, and each of the second layers comprising Co. Each of the first layers has a first thickness between about 0.4 nm to about 0.8 nm and each of the second layers has a second thickness between about 0.3 nm to about 0.6 nm. The spintronic device further comprises one or more layers disposed over the multilayer structure.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 3A illustrates a schematic of a multilayer structure having negative spin polarization and negative anisotropic field (−Hk), according to various embodiments.

FIGS. 3B-3C illustrate schematics of spintronic devices utilizing the multilayer structure of FIG. 3A, according to various embodiments.

FIG. 6A illustrates a graph showing CIP-GMR ratio in % in the device of FIG. 3B utilizing a pinned layer comprising CoFe and the multilayer structure of FIG. 3A as the atomic percent (at %) of Cr of the first sublayer comprising FeCrx of the multilayer structure is varied, according to one embodiment.

FIG. 6B illustrates a graph showing the Hk in T, the Bs in T, and the $M_{eff}$ in T as the atomic percent of Cr of the first sublayer comprising FeCrx of the multilayer structure of FIG. 3A is varied, according to one embodiment.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
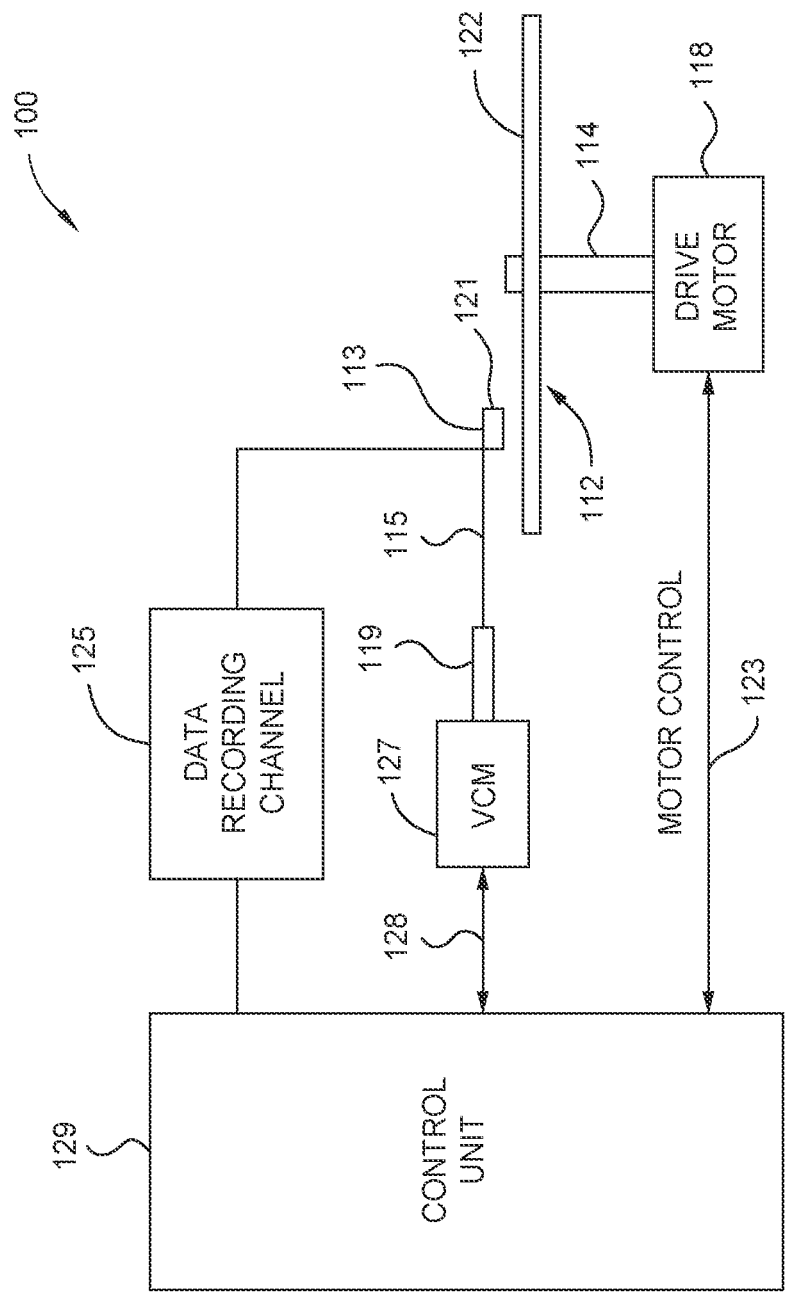
FIG. 1 illustrates a magnetic recording device embodying this disclosure.

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

Aspects of the present disclosure generally relate to a spintronic device for use in a magnetic media drive, a magnetoresistive random access memory device, a magnetic sensor, or a magnetic recording write head. The spintronic device comprises a multilayer structure having a negative spin polarization and a negative anisotropic field. The multilayer structure comprises a plurality of layers, each layer of the plurality of layers comprising a first sublayer comprising Fe and a second sublayer comprising Co. At least one of the first sublayer and the second sublayer comprises one or more of Cr, V, and Ti. The first and second sublayers are alternating. The negative anisotropic field of the multilayer structure is between about −0.5 T to about −0.8 T, and an effective magnetization of the multilayer structure is between about 2.4 T to about 2.8 T.

It is to be understood that the embodiments discussed herein are applicable to a data storage device such as a hard disk drive (HDD) as well as a tape drive such as a tape embedded drive (TED) or an insertable tape media drive such as those made according to Linear Tape Open (LTO) standards. An example TED is described in co-pending patent application titled "Tape Embedded Drive," United States Publication. No. 2020/0258544, filed Mar. 26, 2019, assigned to the same assignee of this application, which is herein incorporated by reference. As such, any reference in the detailed description to an HDD or tape drive is merely for exemplification purposes and is not intended to limit the disclosure unless explicitly claimed. For example, references to disk media in an HDD embodiment are provided as examples only, and can be substituted with tape media in a tape drive embodiment. Furthermore, reference to or claims directed to magnetic recording devices or data storage devices are intended to include at least both HDD and tape drive unless HDD or tape drive devices are explicitly claimed.

It is also to be understood that aspects disclosed herein, such as the magnetoresistive devices, may be used in magnetic sensor applications outside of HDD's and tape media drives such as TED's, such as spintronic devices other than HDD's and tape media drives. As an example, aspects disclosed herein may be used in magnetic elements in magnetoresistive random-access memory (MRAM) devices (e.g., magnetic tunnel junctions as part of memory elements), magnetic sensors or other spintronic devices.

FIG. 1 illustrates a magnetic recording device 100 embodying this disclosure. As shown, at least one rotatable magnetic media 112 is supported on a spindle 114 and rotated by a disk drive motor 118. The magnetic recording on each disk is in the form of any suitable patterns of data tracks, such as annular patterns of concentric data tracks (not shown) on the magnetic media 112.

At least one slider 113 is positioned near the magnetic media 112, each slider 113 supporting one or more magnetic head assemblies 121. As the magnetic media rotates, the slider 113 moves radially in and out over the media surface 122 so that the magnetic head assembly 121 may access different tracks of the magnetic media 112 where desired data are written. Each slider 113 is attached to an actuator arm 119 by way of a suspension 115. The suspension 115 provides a slight spring force that biases the slider 113 toward the media surface 122. Each actuator arm 119 is attached to an actuator means 127. The actuator means 127 as shown in FIG. 1 may be a voice coil motor (VCM). The VCM includes a coil movable within a fixed magnetic field, the direction, and speed of the coil movements being controlled by the motor current signals supplied by control unit 129.

During operation of the magnetic recording device 100, the rotation of the magnetic media 112 generates an air bearing between the slider 113 and the media surface 122 that exerts an upward force or lift on the slider 113. The air bearing thus counter-balances the slight spring force of suspension 115 and supports slider 113 off and slightly above the media 112 surface by a small, substantially constant spacing during normal operation. In the case of EAMR, a DC magnetic field generated from an assist element of the magnetic head assembly 121 enhances the write-ability so that the write element of the magnetic head assembly 121 may efficiently magnetize the data bits in the media 112.

The various components of the magnetic recording device 100 are controlled in operation by control signals generated by control unit 129, such as access control signals and internal clock signals. Typically, the control unit 129 comprises logic control circuits, storage means, and a microprocessor. The control unit 129 generates control signals to control various system operations, such as drive motor control signals on line 123 and head position and seek control signals on line 128. The control signals on line 128 provide the desired current profiles to optimally move and position slider 113 to the desired data track on media 112. Write and read signals are communicated to and from write and read heads on the assembly 121 by way of recording channel 125.

The above description of a typical magnetic disk storage system and the accompanying illustration of FIG. 1 are for representation purposes only. It should be apparent that disk storage systems may contain a large number of disks and actuators, and each actuator may support a number of sliders.

Figure 2:
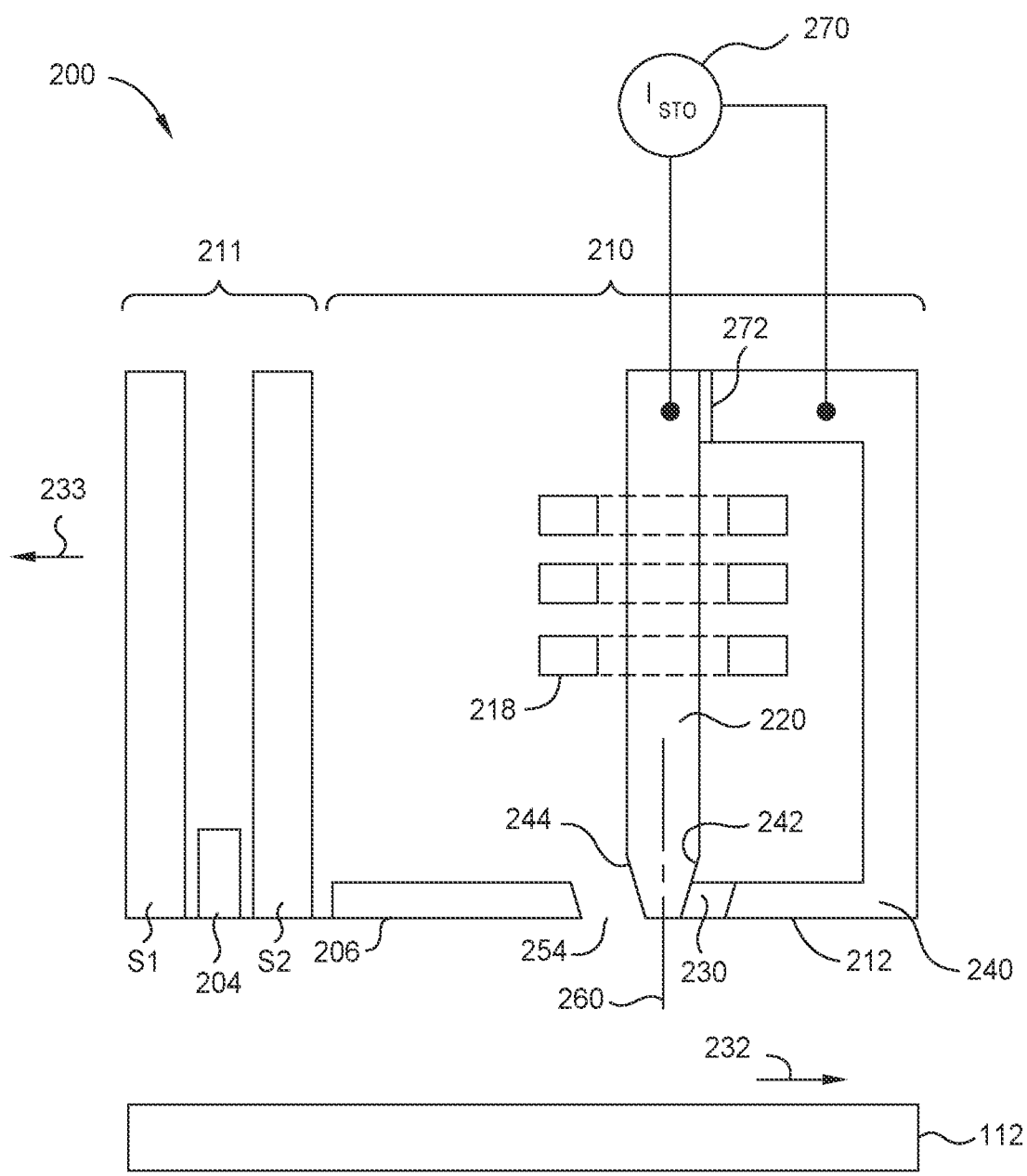
FIG. 2 is a fragmented, cross sectional side view through the center of a read/write head facing the magnetic media, according to one embodiment.

FIG. 2 is a schematic illustration of a cross sectional side view of a head assembly 200 facing the rotatable magnetic disk 112 shown in FIG. 1 or other magnetic storage medium, according to one implementation. The head assembly 200 may correspond to the head assembly 121 described in FIG. 1. The head assembly 200 includes a media facing surface (MFS) 212, such as an air bearing surface (ABS), facing the rotatable magnetic disk 112. As shown in FIG. 2, the rotatable magnetic disk 112 relatively moves in the direction indicated by the arrow 232 and the head assembly 200 relatively moves in the direction indicated by the arrow 233.

In one embodiment, which can be combined with other embodiments, the head assembly 200 includes a magnetic read head 211. The magnetic read head 211 may include a sensing element 204 disposed between shields S1 and S2. The sensing element 204 is a magnetoresistive (MR) sensing element, such an element exerting a tunneling magnetoresistive (TMR) effect, a magnetoresistance (GMR) effect, an extraordinary magneto-Resistive (EMR) effect, or a spin torque oscillator (STO) effect. The magnetic fields of magnetized regions in the rotatable magnetic disk 112, such as perpendicular recorded bits or longitudinal recorded bits, are detectable by the sensing element 204 as the recorded bits.

The head assembly 200 includes a write head 210. In one embodiment, which can be combined with other embodiments, the write head 210 includes a main pole 220, a leading shield 206, a trailing shield (TS) 240, and a spintronic device 230 disposed between the main pole 220 and the TS 240. The main pole 220 serves as a first electrode. Each of the main pole 220, the spintronic device 230, the leading shield 206, and the trailing shield (TS) 240 has a front portion at the MFS.

The main pole 220 includes a magnetic material, such as CoFe, CoFeNi, or FeNi, other suitable magnetic materials. In one embodiment, which can be combined with other embodiments, the main pole 220 includes small grains of magnetic materials in a random texture, such as body-centered cubic (BCC) materials formed in a random texture. In one example, a random texture of the main pole 220 is formed by electrodeposition. The write head 210 includes a coil 218 around the main pole 220 that excites the main pole 220 to produce a writing magnetic field for affecting a magnetic recording medium of the rotatable magnetic disk 112. The coil 218 may be a helical structure or one or more sets of pancake structures.

In one embodiment, which can be combined with other embodiments, the main pole 220 includes a trailing taper 242 and a leading taper 244. The trailing taper 242 extends from a location recessed from the MFS 212 to the MFS 212. The leading taper 244 extends from a location recessed from the MFS 212 to the MFS 212. The trailing taper 242 and the leading taper 244 may have the same degree or different degree of taper with respect to a longitudinal axis 260 of the main pole 220. In one embodiment, which can be combined with other embodiments, the main pole 220 does not include the trailing taper 242 and the leading taper 244. In such an embodiment, the main pole 220 includes a trailing side and a leading side in which the trailing side and the leading side are substantially parallel.

The TS 240 includes a magnetic material, such as FeNi, or other suitable magnetic materials, serving as a second electrode and return pole for the main pole 220. The leading shield 206 may provide electromagnetic shielding and is separated from the main pole 220 by a leading gap 254.

In some embodiments, the spintronic device 230 is positioned proximate the main pole 220 and reduces the coercive force of the magnetic recording medium, so that smaller writing fields can be used to record data. In such embodiments, an electron current is applied to spintronic device 230 from a current source 270 to produce a microwave field. The electron current may include direct current (DC) waveforms, pulsed DC waveforms, and/or pulsed current waveforms going to positive and negative voltages, or other suitable waveforms. In other embodiments, an electron current is applied to spintronic device 230 from a current source 270 to produce a high frequency alternating current (AC) field to the media.

In one embodiment, which can be combined with other embodiments, the spintronic device 230 is electrically coupled to the main pole 220 and the TS 240. The main pole 220 and the TS 240 are separated in an area by an insulating layer 272. The current source 270 may provide electron current to the spintronic device 230 through the main pole 220 and the TS 240. For direct current or pulsed current, the current source 270 may flow electron current from the main pole 220 through the spintronic device 230 to the TS 240 or may flow electron current from the TS 240 through the spintronic device 230 to the main pole 220 depending on the orientation of the spintronic device 230. In one embodiment, which can be combined with other embodiments, the spintronic device 230 is coupled to electrical leads providing an electron current other than from the main pole 220 and/or the TS 240.

FIG. 3A illustrates a schematic of a multilayer structure 300 having negative spin polarization and negative anisotropic field (−Hk), according to one embodiment. For example, the multilayer structure 300 may be used as a free layer in a magnetic tunnel junction (MTJ) device (e.g., spin-orbit torque (SOT) MTJ devices), as a free layer in a spin-orbit torque device in an energy-assisted magnetic recording (EAMR) write head, as a free layer in a magnetoresistive random access memory (MRAM) device, as a field generating layer (FGL) in a microwave assisted magnetic recording (MAMR) write head, as a pinned layer in a magnetoresistive (MR) device, or within other spintronic devices.

As used herein, the multilayer structure 300 may be implemented in magnetic recording heads, including both magnetic recording write heads (e.g., as a FGL in MAMR applications) and magnetic recording read heads (e.g., as a free layer in a sensor within a read head). Furthermore, the multilayer structure 300 may be implemented in magnetic sensors, such as a read sensor or any other non-HDD sensing applications.

The multilayer structure 300 comprises a plurality of layers 302a-302n. Each layer 302a-302n comprises a first sublayer 304 and a second sublayer 306 disposed on the first sublayer 304 such that the first and second sublayers 304, 306 are alternating throughout the multilayer structure 300. The first sublayer 304 comprises iron (Fe), the second sublayer 306 comprises cobalt (Co), and the first sublayer 304 and/or the second sublayer 306 additionally comprises at least one of chromium (Cr), vanadium (V), or titanium (Ti).

For example, in one embodiment, the second sublayer 306 comprises Co, and the first sublayer 304 comprises $FeCr_x$, $FeV_x$, or $FeTi_x$, where the value of x in each is a positive number, and may be a non-integer value or an integer value. For example, the first sublayer 304 may comprise $FeCr_{28}$, $FeCr_{20}$, $FeCr_{40}$, $FeCr_{16}$, $FeCr_{46}$, $FeTi_5$, $FeTi_{11}$, $FeTi_{23}$, $FeV_{10}$, $FeV_{20}$, or $FeV_{30}$. In some embodiments where the second sublayer 306 comprises Co, the first sublayer 304 comprises $FeCr_xV_y$, $FeCr_xTi_y$, $FeV_xTi_y$, or $FeCr_xV_yTi_z$, where the value of x, y, and/or z in each is a positive number, and may be a non-integer value or an integer value. In some embodiments, the value of each of x, y, and/or z is between 1 and 46.

In another embodiment, the first sublayer 304 comprises Fe, and the second sublayer 306 comprises $CoCr_x$, $CoV_x$, or $CoTi_x$, where the value of x in each is a positive number, and may be a non-integer value or an integer value. In some embodiments where the first sublayer 304 comprises Fe, the second sublayer 306 comprises $CoCr_xV_y$, $CoCr_xTi_y$, $CoV_xTi_y$, or $CoCr_xV_yTi_z$, where the value of x, y, and/or z in each is a positive number, and may be a non-integer value or an integer value. In some embodiments, the value of each of x, y, and/or z is between 1 and 46.

In yet another embodiment, both the first and second sublayers 304, 306 comprise one or more of Cr, V, and Ti. For example, the first sublayer 304 comprises one of $FeCr_x$, $FeV_x$, $FeTi_x$, $FeCr_xV_y$, $FeCr_xTi_y$, $FeV_xTi_y$, and $FeCr_xV_yTi_z$, where the value of x in each is a positive number, and may be a non-integer value or an integer value. In some embodiments, the value of each of x, y, and/or z is between 1 and 46. The second sublayer 306 comprises one of $CoCr_x$, $CoV_x$, $CoTi_x$, $CoCr_xV_y$, $CoCr_xTi_y$, $CoV_xTi_y$, and $CoCr_xV_yTi_z$, where the value of each of x, y, and/or z in each is a positive number, and may be a non-integer value or an integer value. In some embodiments, the value of each of x, y, and/or z is between 1 and 46.

Each layer 302a-302n may collectively comprise $Co_a/Fe_b(Cr_xV_yTi_z)$, where a, b, x, y, and z are atomic percentages. One or more of x, y, and z may be 0 at %, so long as at least one of x, y, and z is a positive number greater than 0 at %. The atomic percent of each of Co, Fe, Cr, V, and Ti are selected based on a total number of electrons. For example, a first sublayer 304 comprising Fe and a second sublayer 306 comprising Co has a total electrons/atom of about 26.5. As demonstrated by the Slator Pauling curve, the saturation magnetic flux density (Bs) of the layers 302a-302n decreases as the total number of electrons of each layer 302a-320n decreases by adding one or more of Cr, V, and Ti.

Equation 1 below may be used to determine the amounts of a, b, x, y, and z in $Co_a/Fe_b(Cr_xV_yTi_z)$ based on a total number of electrons:

$$\frac{(27*a)+(26*b)+(24*x)+(23*y)+(22*z)}{100} > 24 \quad \text{Equation 1}$$

Thus, the doping amount of each of Cr, V, and Ti is dependent upon the total number of electrons of each layer 302a-320n. In some embodiments, the total number of electrons/atom is greater than 24, like shown in Equation 1.

Each first sublayer 304 has a first thickness 314 in y-direction, and each second sublayer 306 has a second thickness 316 in the y-direction. As discussed further below in FIGS. 4-5C, the first thickness 314 and the second thickness 316 may be the same, or the first thickness 314 and the second thickness 316 may be different. In some embodiments, the first thickness 314 is greater than or equal to the second thickness 316. The first thickness 314 may be between about 0.3 nm to about 0.8 nm. The second thickness 316 may be between about 0.3 nm to about 0.6 nm.

The multilayer structure 300 may comprise any number of layers 302a-302n until a desired total thickness 310 is reached. The total thickness 310 of the material may be about 1 nm to about 20 nm, such as about 5 nm to about 8 nm. In some embodiments, an additional first sublayer 304a is optionally included as a capping layer of the multilayer structure 300. In such embodiments, the additional first sublayer 304a is in contact with the next layer of the spintronic device, such as a capping layer or a spacer layer. The additional first sublayer 304a has the first thickness 314. The additional first sublayer 304a may be utilized in certain spintronic devices to control both the interface and the bulk effect. For example, FeCr has a stronger negative interface spin polarization than Co, so an additional FeCr layer may be included adjacent to a spacer layer or other subsequent layer as the first additional sublayer 304a. As such, the first additional sublayer 304a may comprise one of $FeCr_x$, $FeV_x$, $FeTi_x$, $FeCr_xV_y$, $FeCr_xTi_y$, $FeV_xTi_y$, or $FeCr_xV_yTi_z$, where the value of x is a positive number, and may be a non-integer value or an integer value. While the second sublayer 306 is shown disposed on the first sublayer 304, in some embodiments, the first sublayer 304 is disposed on the second sublayer 306. In such an embodiment, the additional first sublayer 304a may not be included.

FIG. 3B illustrates a schematic MFS view of a spintronic device 350 utilizing the multilayer structure 300 of FIG. 3A, according to one embodiment. The spintronic device 350 may be used as the spintronic device 230 or the sensing element 204 shown in FIG. 2. For example, the spintronic device 350 may be a SOT MTJ device or a spin-orbit torque device. The spintronic device 350 may be utilized in a magnetic media drive, a magnetoresistive random access memory device, a magnetic sensor, or a magnetic recording write head. The spintronic device 350 is only one example or embodiment of a spintronic device that may utilize the multilayer structure 300, and is not intended to be limiting.

As shown in FIG. 3B, the multilayer structure 300 is disposed over a seed layer 320, a spacer 322 is disposed over the multilayer structure 300, a pinned layer 324 is disposed over the spacer 322, and a cap layer 326 is disposed over the pinned layer 324. The seed layer 320 may comprise a NiFeTa/Ru/Cr multilayer structure. In some embodiments, the seed layer 320 is disposed over or in contact with a main pole (not shown), such as the main pole 220 of FIG. 2. The spacer 322 may comprise Cu, NiAl, or a Ag-based material. A thin layer of Cr or V may optionally be inserted between the multilayer structure 300 and the spacer 322 to enhance the negative interfacial scattering effect. The pinned layer 324 may comprise CoFe. The cap layer 326 may comprise a Cr/Cu/Ru multilayer structure. As utilized in the spintronic device 350, the multilayer structure 300 may comprise between five to ten layers 302a-302n, for example. The multilayer structure 300 may be a free layer.

Figure 3D:
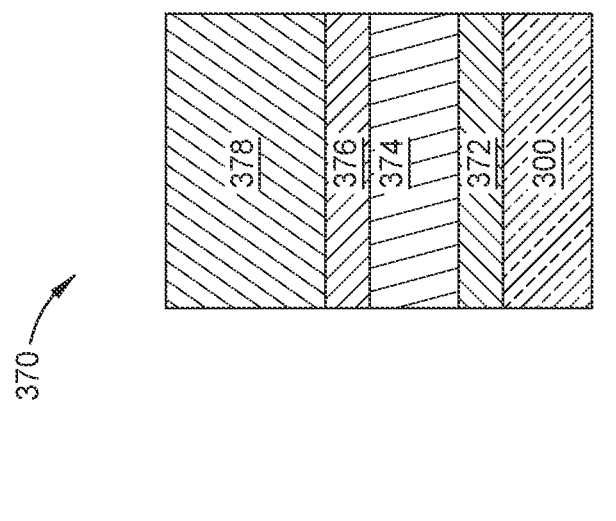
FIG. 3D illustrates a schematic view of a magnetoresistive (MR) sensor utilizing the multilayer structure of FIG. 3A, according to one embodiment.
Figure 3C:
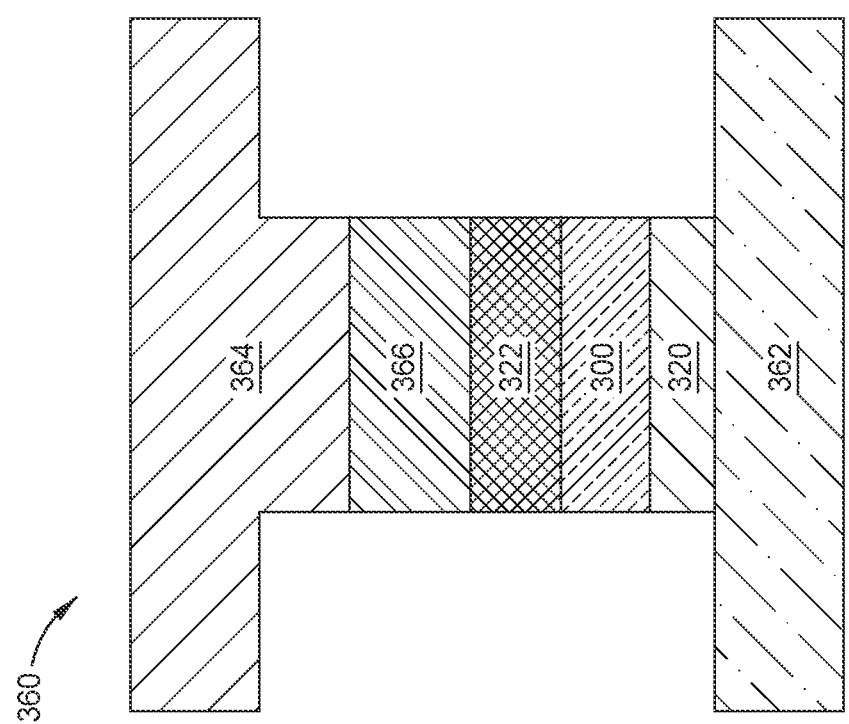

FIG. 3C illustrates a schematic MFS view of a spintronic device 360 utilizing the multilayer structure 300 of FIG. 3A, according to another embodiment. The spintronic device 360 may be used as the spintronic device 230 or the sensing element 204 of the read head 211 shown in FIG. 2. The spintronic device 360 may be utilized within a magnetic sensor outside of the context of a read head such as in FIG. 2, or a magnetic recording write head to provide an AC field (e.g., as part of a spin torque oscillator (STO) for MAMR. As shown in FIG. 3C, a seed layer 320 is disposed over a main pole 362, the multilayer structure 300 is disposed over the seed layer 320, a spacer 322 is disposed over the multilayer structure 300, a magnetic layer 366, such as a spin polarization layer (SPL) or a spin torque layer (STL) is disposed over the spacer 322, and a trailing shield 364 is disposed over the magnetic layer 366.

The multilayer structure 300 may be a FGL. The main pole 362 includes a magnetic material, such as CoFe, CoFeNi, or FeNi, other suitable magnetic materials. The seed layer 320 may comprise a NiFeTa/Ru/Cr multilayer structure. The spacer 322 may comprise Cu, NiAl, or a Ag-based material. A thin layer of Cr or V may optionally be inserted between the multilayer structure 300 and the spacer 322 to enhance the negative interfacial scattering effect. The magnetic layer 366 may comprise NiFe, CoMnGe, or CoFe. The trailing shield 364 includes a magnetic material, such as CoFe, FeNi, or other suitable magnetic materials, serving as a second electrode and return pole for the main pole 362. The main pole 362 may be the main pole 220 of FIG. 2 and the trailing shield may be the TS 240 of FIG. 2. As utilized in the spintronic device 360, the multilayer structure 300 may comprise between five to ten layers 302a-302n, for example, resulting in a total thickness of the multilayer structure 300 being between about 4 nm to about 15 nm.

FIG. 3D illustrates a schematic MFS view of a spintronic device or MR sensor 370 utilizing the multilayer structure 300 of FIG. 3A, according to one embodiment. The spintronic device or MR sensor 370 may be used as the sensing element 204 or the spintronic device 230 of the read head 211 shown in FIG. 2. The MR sensor 370 may be utilized in an MR device, a magnetic recording read head, or a magnetic sensor outside of the context of a read head such as in FIG. 2. For example, the spintronic device or MR sensor 370 may be utilized in a tunneling magnetoresistance (TMR) device, in a giant magnetoresistance (GMR) device, in a current-in-plane (CIP) GMR device, or in a current-perpendicular-to-plane (CPP) GMR device. The MR sensor 370 of FIG. 3D may be interchangeably referred to as spintronic device 370 throughout.

As shown in FIG. 3D, a spacer layer 372 is disposed on the multilayer structure 300, a first pinned layer 374 is disposed on the spacer layer 372, a barrier layer 376 is disposed on the first pinned layer 374, and a free layer 378 is disposed on the barrier layer 376. In the spintronic device or MR sensor 370, the multilayer structure 300 may be a second pinned layer, where the magnetizations of the first pinned layer 374 and the multilayer structure 300 are anti-parallel to each other. In a MR device, the multilayer structure 300 may be disposed over a first shield (not shown), and a second shield (not shown) may be disposed over the free layer 378. Furthermore, one or more layers may be disposed between the multilayer structure 300 and the first shield, such as a seed layer and/or a spacer layer, and one or more layers may be disposed between the free layer 378 and the second shield, such as a cap layer.

The first pinned layer 374 is magnetic and is formed of a material that includes one or more of Co, Fe, B, Ni, and/or an alloy thereof, such as CoFe or NiFe. The first pinned layer 374 may have a positive spin polarization, whereas the multilayer structure 300 has a negative spin polarization. The spacer layer 372 is nonmagnetic and is formed of a metal material, such as Ru. The spacer layer 372 facilitates the magnetizations of the first pinned layer 374 and the multilayer structure 300 being anti-parallel to each other. The barrier layer 376 is nonmagnetic and includes MgO, aluminum oxide ($Al_xO_x$) such as $Al_2O_3$, or any other suitable insulation material. The free layer 378 is formed of a material that includes one or more of Ni, Fe, Co, B, and/or Hf.

Figure 3E:
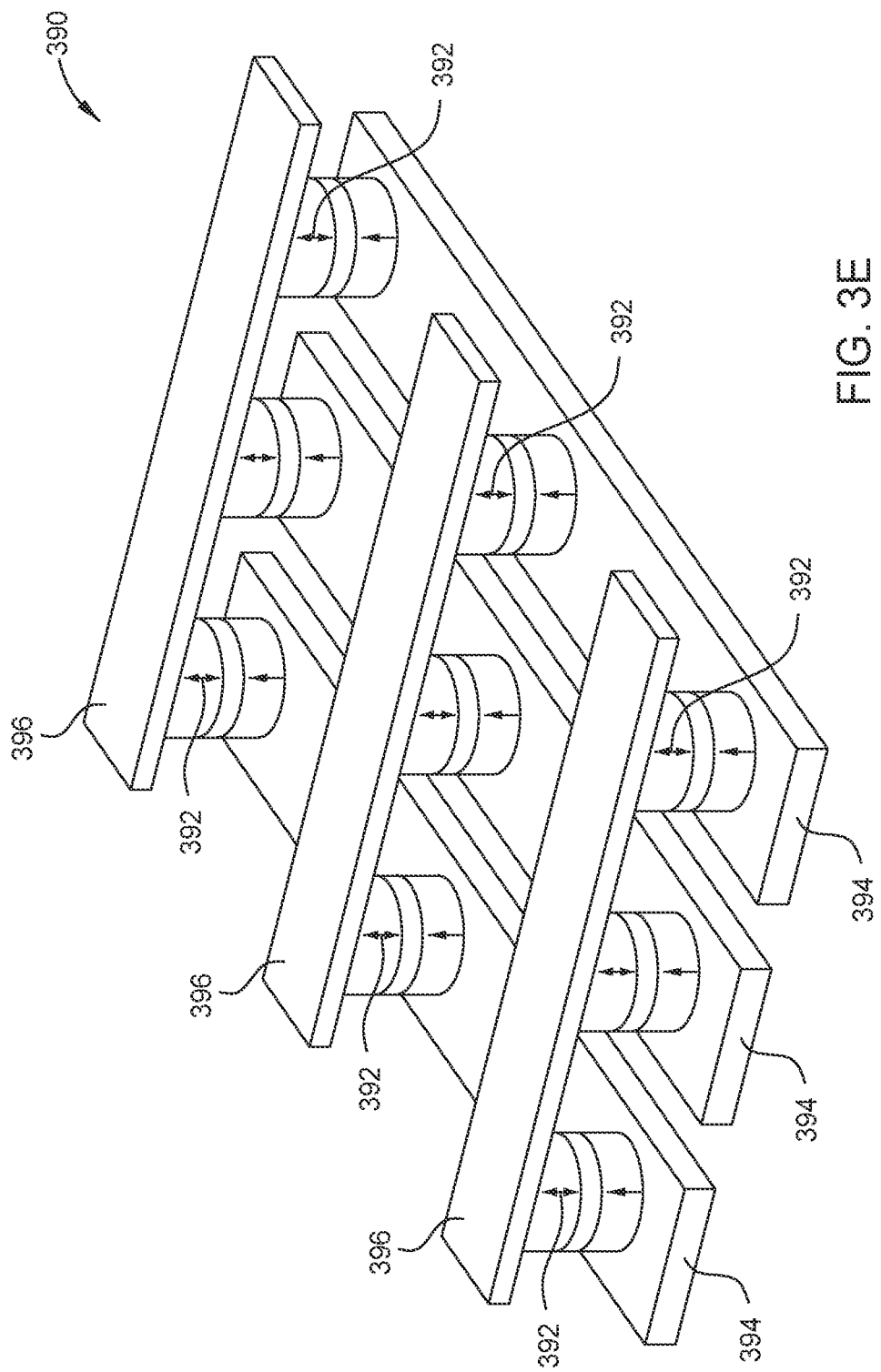
FIG. 3E illustrates a schematic view of certain embodiments of a memory cell array in a cross-point configuration.

FIG. 3E is a schematic view of certain embodiments of a memory cell array 390 in a cross-point configuration. The memory cell array 390 is comprised of a plurality of memory cells 392 formed out of spintronic devices, such as SOT-based MRAM devices. In some embodiments, each memory cell 392 of the memory cell array 390 comprises the spintronic device 350 of FIG. 3B including the multilayer structure 300. In other embodiments, the memory cells 392 of the memory cell array 390 may comprise other types of spintronic devices comprising the multilayer structure 300 of FIG. 3A, such as the spintronic device 360 of FIG. 3C.

Each of the memory cells 392 may be in a state representing either a 1 or a 0 bit value. The memory cell array 390 comprises a plurality of bottom electrodes 394 and a plurality of spin Hall electrodes or spin orbit material electrodes 396. The spin orbit material electrodes 396 comprise the multilayer structure 300 of FIG. 3A. Each memory cell 392 may be part of a two-terminal device or a three terminal device. For example, in two-terminal devices, the bottom electrodes 394 may serve as bit lines, and the spin orbit material electrodes 396 may serve as word lines. For example, in three-terminal devices, the bottom electrode 394 can serve as bit lines and read word lines and the spin orbit material electrodes 396 may service as write word lines.

The cross-point array implementation as shown in FIG. 3E is just an example MRAM implementation, and the various spintronic device embodiments disclosed herein can be implemented in other types of MRAM devices. As such, the memory cell array 390 is not intended to be limiting. Other architectures of the memory cell array 390 are possible including various types and combinations of terminals, gates, transistors, and lines.

Figure 4:
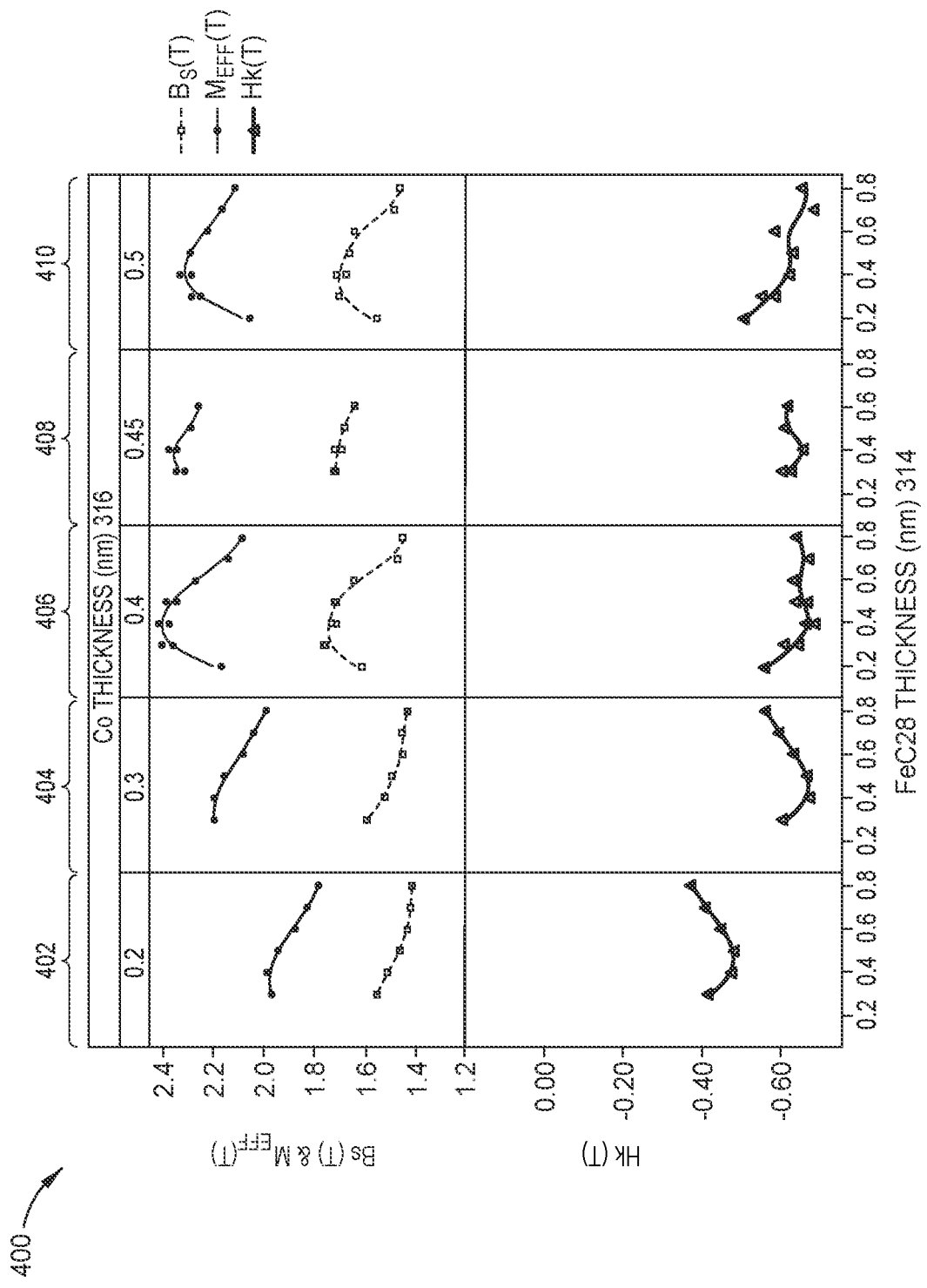
FIG. 4 illustrates a graph showing the Hk, the saturation magnetic flux density (Bs), and the effective magnetization ($M_{eff}$) as the thicknesses of the first and second sublayers of the multilayer structure of FIG. 3A are varied, according to one embodiment.

FIG. 4 illustrates a graph 400 showing the Hk in Tesla (T), the saturation magnetic flux density (Bs) in T, and the effective magnetization ($M_{eff}$) in T of the multilayer structure 300 of FIG. 3A as the thicknesses 314, 316 of the first and second sublayers 304, 306 are varied in nm, according to one embodiment. The multilayer structure 300 may be within a spintronic device, such as the spintronic device 350 of FIG. 3B, the spintronic device 360 of FIG. 3C, or the MR sensor 370 of FIG. 3D.

In the graph 400, the first sublayer 304 comprises $FeCr_{28}$, and the second sublayer 306 comprises Co. While the first sublayer 304 comprises $FeCr_{28}$ in the embodiment shown in the graph 400, the first sublayer 304 may instead comprise $FeV_x$, $FeTi_x$, $FeCr_xV_y$, $FeCr_xTi_y$, $FeV_xTi_y$, $FeCr_xV_yTi_z$, or other $FeCr_x$ materials discussed above, and the first sublayer 304 is not intended to be limited to only $FeCr_{28}$. Furthermore, the second sublayer 306 may comprise one or more of Cr, V, or Ti as well, as discussed above. Similar results are expected when the first sublayer 304 comprises Fe and the second sublayer 306 comprises one of $CoCr_x$, $CoV_x$, $CoTi_x$, $CoCr_xV_y$, $CoCr_xTi_y$, $CoV_xTi_y$, or $CoCr_xV_yTi_z$, where the value of each of x, y, and/or z in each is a positive number, and may be a non-integer value or an integer value. As such, the graph 400 is not intended to be limited to only $FeCr_{28}$ as the material of the first sublayer 304 and Co as the material of the second sublayer 306.

The thickness 314 of the first sublayer 304 is shown on the bottom of the graph along the x-axis while the thickness 316 of the second sublayer 306 is shown on the top of the graph 400 along the x-axis. The graph 400 is broken down into several portions 402-410. In each of the portions 402-410, the first sublayer 304 varies in thickness from about 0.2 nm to about 0.8 nm. In the first portion 402, the second sublayer 306 has a thickness of about 0.2 nm. In the second portion 404, the second sublayer 306 has a thickness of about 0.3 nm. In the third portion 406, the second sublayer 306 has a thickness of about 0.4 nm. In the fourth portion 408, the second sublayer 306 has a thickness of about 0.45 nm. In the fifth portion 410, the second sublayer 306 has a thickness of about 0.5 nm.

The graph 400 illustrates that a negative Hk of about −0.6 T is achieved when the first sublayer 304 has a thickness 314 between about 0.3 nm to about 0.8 nm and the second sublayer 306 has a thickness 316 of about 0.3 nm to about 0.6 nm. The graph 400 further illustrates that larger $M_{eff}$ and Bs are achieved when the first sublayer 304 has a thickness 314 between about 0.3 nm to about 0.5 nm and the second sublayer 306 has a thickness 316 of about 0.35 nm to about 0.5 nm.

Figure 5A:
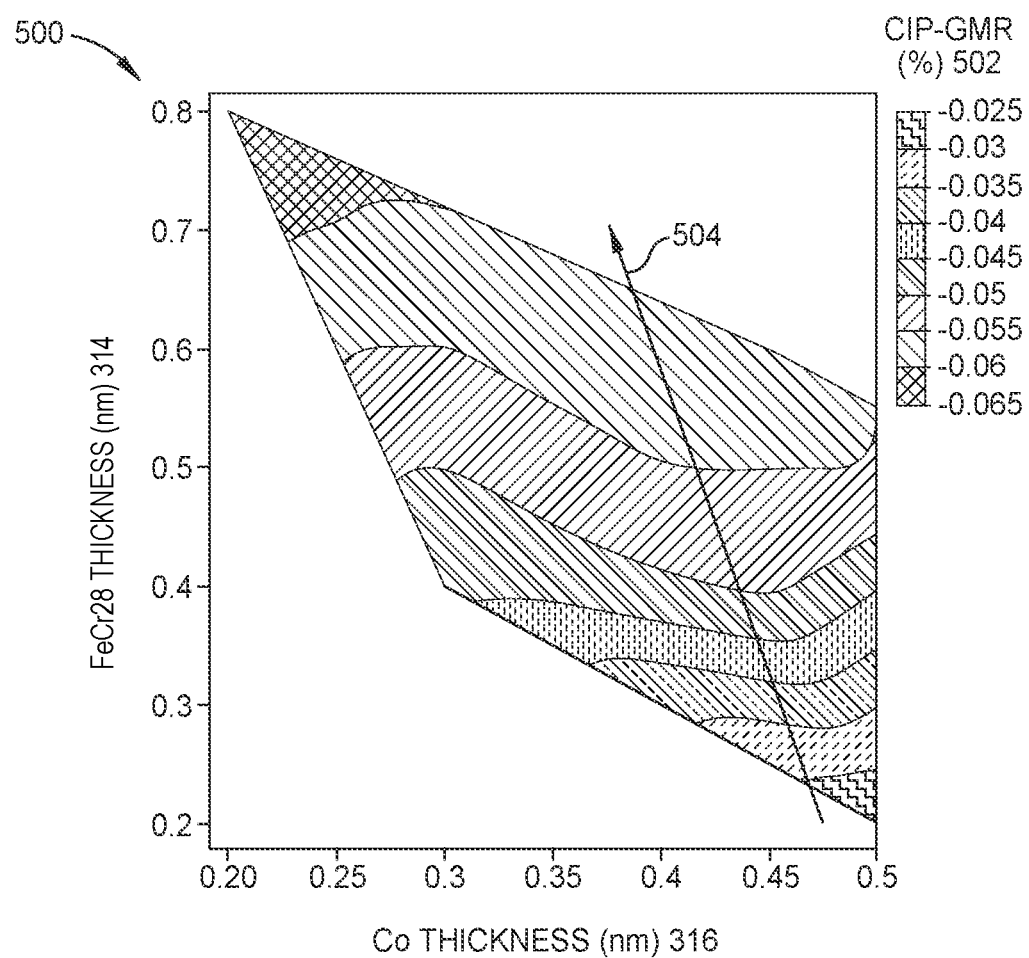
FIG. 5A illustrates a graph showing the current-in-plane (CIP) giant magnetoresistance (GMR) (%) in the device of FIG. 3B utilizing a pinned layer comprising CoFe and the multilayer structure of FIG. 3A as the thicknesses of the first and second sublayers of the multilayer structure are varied in nm, according to one embodiment.

FIG. 5A illustrates a graph 500 showing the current-in-plane (CIP) giant magnetoresistance (GMR) (%) in the device 350 of FIG. 3B utilizing a pinned layer 324 comprising CoFe and the multilayer structure 300 of FIG. 3A as the thicknesses 314, 316 of the first and second sublayers 304, 306 of the multilayer structure 300 are varied in nm, according to one embodiment. The multilayer structure 300 may be within a spintronic device, such as the spintronic device 350 of FIG. 3B, the spintronic device 360 of FIG. 3C, or the MR sensor 370 of FIG. 3D.

In the graph 500, the first sublayer 304 comprises $FeCr_{28}$, and the second sublayer 306 comprises Co. While the first sublayer 304 comprises $FeCr_{28}$ in the embodiment shown in the graph 500, the first sublayer 304 may instead comprise $FeV_x$, $FeTi_x$, $FeCr_xV_y$, $FeCr_xTi_y$, $FeV_xTi_y$, $FeCr_xV_yTi_z$, or other $FeCr_x$ materials discussed above, and the first sublayer 304 is not intended to be limited to only $FeCr_{28}$. Furthermore, the second sublayer 306 may comprise one or more of Cr, V, or Ti as well, as discussed above. Similar results are expected when the first sublayer 304 comprises Fe and the second sublayer 306 comprises one of $CoCr_x$, $CoV_x$, $CoTi_x$, $CoCr_xV_y$, $CoCr_xTi_y$, $CoV_xTi_y$, or $CoCr_xV_yTi_z$, where the value of each of x, y, and/or z in each is a positive number, and may be a non-integer value or an integer value. As such, the graph 500 is not intended to be limited to only $FeCr_{28}$ as the material of the first sublayer 304 and Co as the material of the second sublayer 306.

The thickness 314 of the first sublayer 304 is shown on the y-axis, the thickness 316 of the second sublayer 306 is shown on the x-axis, and the negative CIP-GMR achieved is indicated by the key 502. A negative CIP-GMR indicates that the multilayer 300 has a negative spin polarization since the pinned layer comprising CoFe has a positive spin polarization. As shown by the arrow 504, the first sublayer 304 having a larger thickness 314 of about 0.3 nm to about 0.8 nm and the second sublayer 306 having a thickness between about 0.35 nm to about 0.5 nm results in a higher negative spin polarization.

Figure 5B:
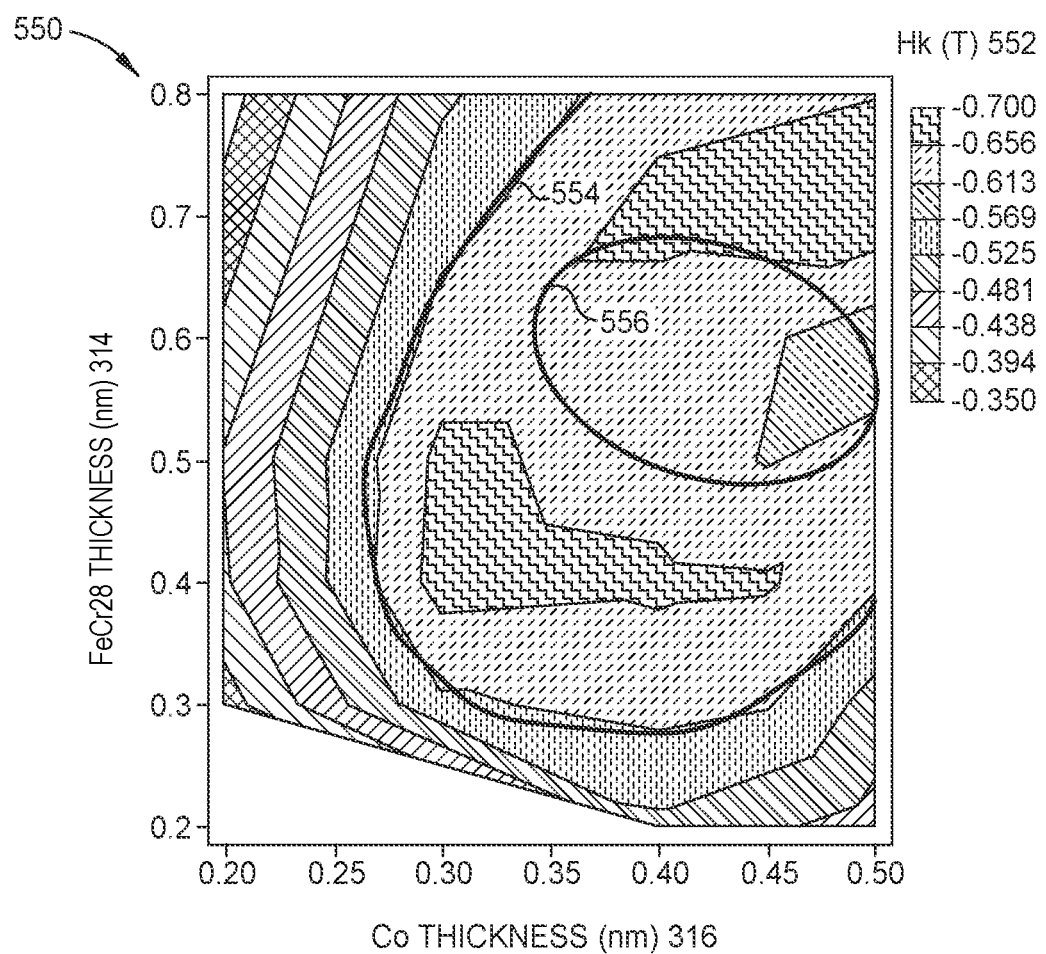
FIG. 5B illustrates a graph showing the Hk in T as the thicknesses of the first and second sublayers of the multilayer structure of FIG. 3A are varied in nm, according to one embodiment.

FIG. 5B illustrates a graph 550 showing the Hk in T as the thicknesses 314, 316 of the first and second sublayers 304, 306 of the multilayer structure 300 of FIG. 3A are varied in nm, according to one embodiment. The multilayer structure 300 may be within a spintronic device, such as the spintronic device 350 of FIG. 3B, the spintronic device 360 of FIG. 3C, or the MR sensor 370 of FIG. 3D.

In the graph 550, the first sublayer 304 comprises $FeCr_{28}$, and the second sublayer 306 comprises Co. While the first sublayer 304 comprises $FeCr_{28}$ in the embodiment shown in the graph 550, the first sublayer 304 may instead comprise $FeV_x$, $FeTi_x$, $FeCr_xV_y$, $FeCr_xTi_y$, $FeV_xTi_y$, $FeCr_xV_yTi_z$, or other $FeCr_x$ materials discussed above, and similar results would be obtained. Furthermore, the second sublayer 306 may comprise one or more of Cr, V, or Ti as well, as discussed above. Similar results are expected when the first sublayer 304 comprises Fe and the second sublayer 306 comprises one of $CoCr_x$, $CoV_x$, $CoTi_x$, $CoCr_xV_y$, $CoCr_xTi_y$, $CoV_xTi_y$, or $CoCr_xV_yTi_z$, where the value of each of x, y, and/or z in each is a positive number, and may be a non-integer value or an integer value. As such, the graph 550 is not intended to be limited to only $FeCr_{28}$ as the material of the first sublayer 304 and Co as the material of the second sublayer 306.

The thickness 314 of the first sublayer 304 is shown on the y-axis, the thickness 316 of the second sublayer 306 is shown on the x-axis, and the Hk achieved is indicated by the key 552. Line 554 illustrates an approximate boundary of the thicknesses 314, 316 of the first and second sublayers 304, 306 that achieve the highest negative Hk. As shown by line 554, the first sublayer 304 having a thickness 314 between about 0.3 nm to about 0.8 nm and the second sublayer 306 having a thickness 316 between about 0.3 nm to about 0.6 nm results in a Hk of about −0.6 T to about −0.7 T.

Line 556 illustrates or encompasses an approximate boundary of the thicknesses 314, 316 of the first and second sublayers 304, 306 that achieve the highest negative Hk and the highest negative spin polarization using the data from graph 500 of FIG. 5A. As shown by line 556, the first sublayer 304 having a thickness 314 between about 0.5 nm to about 0.7 nm and the second sublayer 306 having a thickness 316 between about 0.35 nm to about 0.5 nm results in the highest negative Hk and the highest negative spin polarization collectively.

Figure 5C:
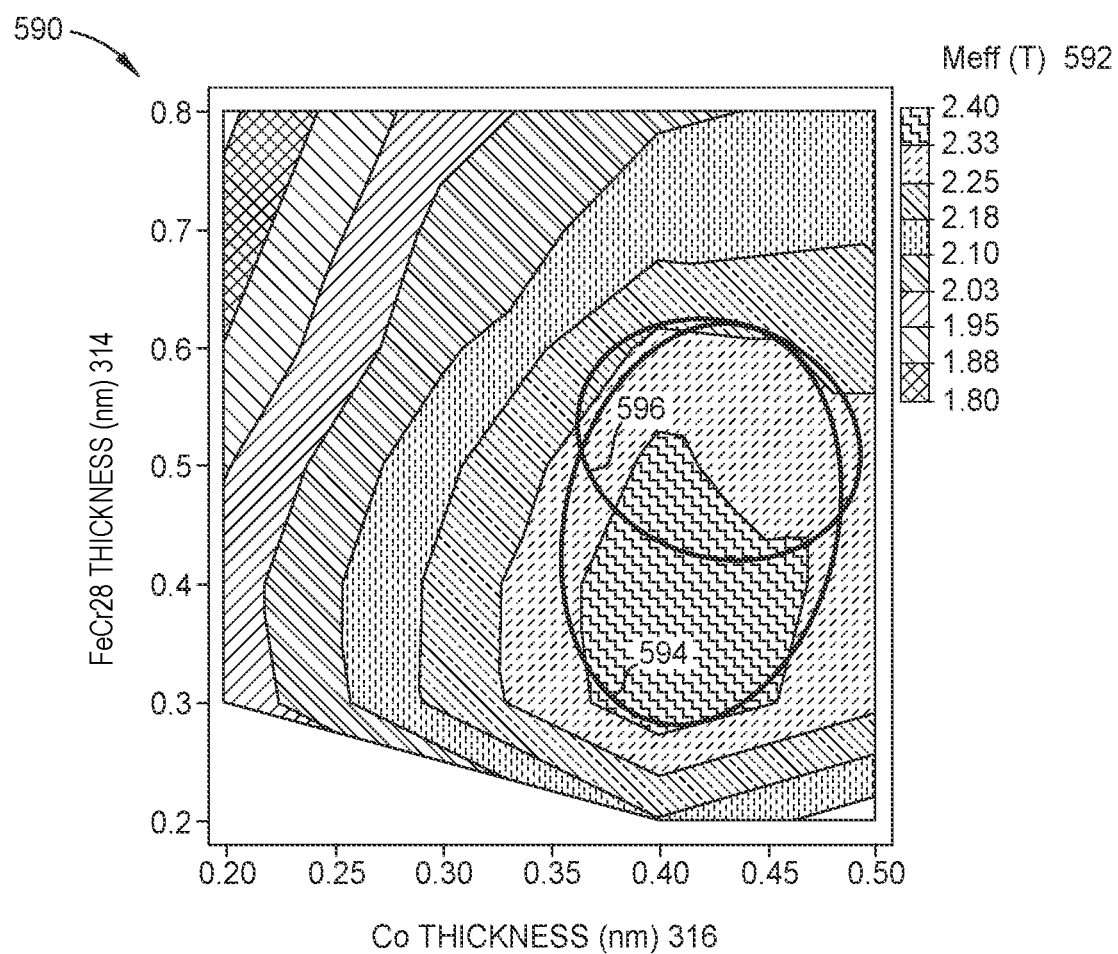
FIG. 5C illustrates a graph showing the $M_{eff}$ in T as the thicknesses of the first and second sublayers of the multilayer structure of FIG. 3A are varied in nm, according to one embodiment.

FIG. 5C illustrates a graph 590 showing the $M_{eff}$ in T as the thicknesses 314, 316 of the first and second sublayers 304, 306 of the multilayer structure 300 of FIG. 3A are varied in nm, according to one embodiment. The multilayer structure 300 may be within a spintronic device, such as the spintronic device 350 of FIG. 3B, the spintronic device 360 of FIG. 3C, or the MR sensor 370 of FIG. 3D.

In the graph 550, the first sublayer 304 comprises $FeCr_{28}$, and the second sublayer 306 comprises Co. While the first sublayer 304 comprises $FeCr_{28}$ in the embodiment shown in the graph 550, the first sublayer 304 may instead comprise $FeV_x$, $FeTi_x$, $FeCr_xV_y$, $FeCr_xTi_y$, $FeV_xTi_y$, $FeCr_xV_yTi_z$, or other $FeCr_x$ materials discussed above, and similar results would be obtained. Furthermore, the second sublayer 306 may comprise one or more of Cr, V, or Ti as well, as discussed above. Similar results are expected when the first sublayer 304 comprises Fe and the second sublayer 306 comprises one of $CoCr_x$, $CoV_x$, $CoTi_x$, $CoCr_xV_y$, $CoCr_xTi_y$, $CoV_xTi_y$, or $CoCr_xV_yTiz$, where the value of each of x, y, and/or z in each is a positive number, and may be a non-integer value or an integer value. As such, the graph 590 is not intended to be limited to only $FeCr_{28}$ as the material of the first sublayer 304 and Co as the material of the second sublayer 306.

The thickness 314 of the first sublayer 304 is shown on the y-axis, the thickness 316 of the second sublayer 306 is shown on the x-axis, and the $M_{eff}$ achieved is indicated by the key 592. Line 594 illustrates or encompasses an approximate boundary of the thicknesses 314, 316 of the first and second sublayers 304, 306 that achieve the highest $M_{eff}$. As shown by line 594, the first sublayer 304 having a thickness 314 between about 0.3 nm to about 0.8 nm and the second sublayer 306 having a thickness 316 between about 0.3 nm to about 0.6 nm results in a $M_{eff}$ of about 2.2 T to about 2.6 T.

Line 596 illustrates or encompasses an approximate boundary of the thicknesses 314, 316 of the first and second sublayers 304, 306 that achieve the highest $M_{eff}$ and the highest negative spin polarization using the data from graph 500 of FIG. 5A. As shown by line 596, the first sublayer 304 having a thickness 314 between about 0.4 nm to about 0.6 nm and the second sublayer 306 having a thickness 316 between about 0.35 nm to about 0.5 nm results in the highest $M_{eff}$ and the highest negative spin polarization collectively.

Thus, taking each of the graphs 500, 550, 590 of FIGS. 5A-5C into consideration, the thicknesses 314, 316 of the first and second sublayers 304, 306 may be selected based on the desired overall properties of the multilayer structure 300 within the device. For example, if a higher $M_{eff}$ is desired, the first sublayer 304 may have a thickness of about 0.4 nm to about 0.6 nm, whereas if a higher negative Hk is desired, the first sublayer 304 may have a thickness of about 0.5 nm to about 0.7 nm. As such, the multilayer structure of the multilayer structure 300 may be tailored or modified as needed to produce the desired properties.

FIG. 6A illustrates a graph 600 showing CIP-GMR ratio in % in the device 350 of FIG. 3B utilizing a pinned layer 324 comprising CoFe and the multilayer structure 300 of FIG. 3A as the atomic percent (at %) of Cr of the first sublayer 304 comprising $FeCr_x$ of the multilayer structure 300 is varied, according to one embodiment. The multilayer structure 300 may be within a spintronic device, such as the spintronic device 350 of FIG. 3B, the spintronic device 360 of FIG. 3C, or the MR sensor 370 of FIG. 3D.

While the first sublayer 304 comprises $FeCr_x$ in the embodiment shown in the graph 600, the first sublayer 304 may instead comprise $FeV_x$, $FeTi_x$, $FeCr_xV_y$, $FeCr_xTi_y$, $FeV_xTi_y$, or $FeCr_xV_yTi_z$, in which case the atomic percentage of Cr, V, and/or Ti would be varied in a similar manner to achieve similar results. Furthermore, the second sublayer 306 may comprise one or more of Cr, V, or Ti as well, as discussed above. Similar results are expected when the first sublayer 304 comprises Fe and the second sublayer 306 comprises one of $CoCr_x$, $CoV_x$, $CoTi_x$, $CoCr_xV_y$, $CoCr_xTi_y$, $CoV_xTi_y$, or $CoCr_xV_yTi_z$, where the value of each of x, y, and/or z in each is a positive number, and may be a non-integer value or an integer value. As such, the graph 600 is not intended to be limited to only $FeCr_x$ as the material of the first sublayer 304 and Co as the material of the second sublayer 306.

As shown in the graph 600, Cr in an atomic percent between about 20% to about 40% results in the largest negative CIP-GMR of about −0.025% to about −0.05% when the first sublayer 304 has a thickness of about 0.4 nm. Furthermore, Cr in an atomic percent between about 28% (i.e., $FeCr_{28}$) results in a negative CIP-GMR of about −0.04% to about −0.05%.

FIG. 6B illustrates a graph 650 showing the Hk in T, the Bs in T, and the $M_{eff}$ in T of the multilayer structure 300 of FIG. 3A as the atomic percent (at %) of Cr of the first sublayer 304 comprising $FeCr_x$ is varied, according to one embodiment. The multilayer structure 300 may be within a spintronic device, such as the spintronic device 350 of FIG. 3B, the spintronic device 360 of FIG. 3C, or the MR sensor 370 of FIG. 3D.

While the first sublayer 304 comprises $FeCr_x$ in the embodiment shown in the graph 650, the first sublayer 304 may instead comprise $FeV_x$, $FeTi_x$, $FeCr_xV_y$, $FeCr_xTi_y$, $FeV_xTi_y$, or $FeCr_xV_yTi_z$, in which case the atomic percentage of Cr, V, and/or Ti would be varied in a similar manner to achieve similar results. Furthermore, the second sublayer 306 may comprise one or more of Cr, V, or Ti as well, as discussed above. Similar results are expected when the first sublayer 304 comprises Fe and the second sublayer 306 comprises one of $CoCr_x$, $CoV_x$, $CoTi_x$, $CoCr_xV_y$, $CoCr_xTi_y$, $CoV_xTi_y$, or $CoCr_xV_yTi_z$, where the value of each of x, y, and/or z in each is a positive number, and may be a non-integer value or an integer value. As such, the graph 650 is not intended to be limited to only $FeCr_x$ as the material of the first sublayer 304 and Co as the material of the second sublayer 306.

As shown by the graph 650, Cr in an atomic percent between about 20% (i.e., $FeCr_{20}$) results in a $M_{eff}$ of about 2.5 T to about 2.7 T and a Hk of about −0.7 T. Thus, taking each of the graphs 600, 650 of FIGS. 6A-6B into consideration, the $FeCr_x$ composition of the first sublayer 304 may be selected based on the desired overall properties of the multilayer structure 300 within the device. For example, if a higher $M_{eff}$ or a higher negative Hk is desired, the first sublayer 304 may comprise $FeCr_{20}$, whereas if a higher negative spin polarization is desired, the first sublayer 304 may comprise $FeCr_{28}$. As such, the multilayer structure of the multilayer structure 300 may be tailored or modified as needed to produce the desired properties.

Therefore, utilizing a multilayer structure comprising alternating layers of Co and Fe, where at least one of the Co or Fe layers comprise one or more of Cr, V, and Ti, both a negative spin polarization and a negative anisotropic field can be achieved. Furthermore, the various parameters of the multilayer structure may be modified as need to produce desired properties of the multilayer structure, such as varying the thickness of the Co and Fe sublayers or varying the composition of Cr, V, and/or Ti used. As such, spintronic devices, such as spintronic devices included within MAMR, CPP-GMR, and MRAM devices, have more freedom, resulting in more effective and improved devices.

In one embodiment, a spintronic device comprises a multilayer structure having a negative spin polarization and a negative anisotropic field, the multilayer structure comprising a plurality of layers, each layer of the plurality of layers comprising a first sublayer comprising Fe and a second sublayer comprising Co, wherein at least one of the first sublayer and the second sublayer further comprise one or more of Cr, V, and Ti. The first and second sublayers are alternating.

The first sublayer comprises one of $FeCr_x$, $FeV_x$, $FeTi_x$, $FeCr_xV_y$, $FeCr_xTi_y$, $FeV_xTi_y$, or $FeCr_xV_yTi_z$. The value of each of x, y, and z is a positive number. The second sublayer comprises one of $CoCr_x$, $CoV_x$, $CoTi_x$, $CoCr_xV_y$, $CoCr_xTi_y$, $CoV_xTi_y$, or $CoCr_xV_yTi_z$. The value of each of x, y, and z is a positive number. Each of the first sublayers has a first thickness between about 0.4 nm to about 0.8 nm. Each of the second sublayers has a second thickness between about 0.3 nm to about 0.6 nm. The multilayer structure is a free layer, a pinned layer, or a field generating layer. A magnetic media drive comprises the spintronic device. A magnetoresistive random access memory device comprises the spintronic device. A magnetic sensor comprises the spintronic device. A magnetic recording head comprises the spintronic device.

In another embodiment, a spintronic device comprises a substrate and a multilayer structure having a negative spin polarization and a negative anisotropic field disposed over the substrate, the multilayer structure comprising a plurality of alternating first layers and second layers. Each of the first layers comprises Fe and one or more of Cr, V, and Ti, and each of the second layers comprises Co. Each of the first layers has a first thickness greater than or equal to a second thickness of each of the second layers. The spintronic device further comprises a cap layer disposed over the multilayer structure.

The multilayer structure is a free layer, a pinned layer, or a field generating layer. Each of the first layers has a first thickness between about 0.4 nm to about 0.8 nm and each of the second layers has a second thickness between about 0.3 nm to about 0.6 nm. The first layers each comprises one of FeCr$_x$, FeV$_x$, FeTi$_x$, FeCr$_x$V$_y$, FeCr$_x$Ti$_y$, FeV$_x$Ti$_y$, or FeCr$_x$V$_y$Ti$_z$. Each of x, y, and z is a number between 1 and 46. The second layers each comprises one of CoCr$_x$, CoV$_x$, CoTi$_x$, CoCr$_x$V$_y$, CoCr$_x$Ti$_y$, CoV$_x$Ti$_y$, or CoCr$_x$V$_y$Ti$_z$. Each of x, y, and z is a number between 1 and 46. The cap layer is an additional first layer comprising FeCr$_x$, FeV$_x$, FeTi$_x$, FeCr$_x$V$_y$, FeCr$_x$Ti$_y$, FeV$_x$Ti$_y$, or FeCr$_x$V$_y$Ti$_z$ having the first thickness. A magnetic media drive comprises the spintronic device. A magnetoresistive random access memory device comprises the spintronic device. A magnetic sensor comprises the spintronic device. A magnetic recording head comprises the spintronic device.

In yet another embodiment, a spintronic device comprises a multilayer structure having a negative spin polarization and a negative anisotropic field, the multilayer structure comprising a plurality of alternating first layers and second layers. Each of the first layers comprises at least one of FeCr$_x$, FeV$_x$, FeTi$_x$, FeCr$_x$V$_y$, FeCr$_x$Ti$_y$, FeV$_x$Ti$_y$, and FeCr$_x$V$_y$Ti$_z$, where each of x, y, and z is a positive number, and each of the second layers comprising Co. Each of the first layers has a first thickness between about 0.4 nm to about 0.8 nm and each of the second layers has a second thickness between about 0.3 nm to about 0.6 nm. The spintronic device further comprises one or more layers disposed over the multilayer structure.

The one or more layers comprise a cap layer disposed in contact with the multilayer structure, the cap layer being an additional first layer comprising FeCr$_x$, FeV$_x$, FeTi$_x$, FeCr$_x$V$_y$, FeCr$_x$Ti$_y$, FeV$_x$Ti$_y$, or FeCr$_x$V$_y$Ti$_z$ having the first thickness. The multilayer structure is a free layer, a pinned layer, or a field generating layer. The negative anisotropic field of the multilayer structure is between about −0.5 T to about −0.8 T, and an effective magnetization of the multilayer structure is between about 2.4 T to about 2.8 T. Each of the second layers further comprises one or more of Cr, V, and Ti. A magnetic media drive comprises the spintronic device. A magnetoresistive random access memory device comprises the spintronic device. A magnetic sensor comprises the spintronic device. A magnetic recording head comprises the spintronic device.

While the foregoing is directed to embodiments of the present disclosure, other and further embodiments of the disclosure may be devised without departing from the basic scope thereof, and the scope thereof is determined by the claims that follow.

What is claimed is:

1. A spintronic device, comprising:
    a multilayer structure having a negative spin polarization and a negative anisotropic field, the multilayer structure comprising a plurality of layers, each layer of the plurality of layers comprising a first sublayer comprising Fe and a second sublayer comprising Co, wherein at least one of the first sublayer and the second sublayer further comprise one or more of Cr, V, and Ti, and wherein the first and second sublayers are alternating.

2. The spintronic device of claim 1, wherein the first sublayer comprises one of FeCr$_x$, FeV$_x$, FeTi$_x$, FeCr$_x$V$_y$, FeCr$_x$Ti$_y$, FeV$_x$Ti$_y$, or FeCr$_x$V$_y$Ti$_z$, and wherein the value of each of x, y, and z is a positive number.

3. The spintronic device of claim 1, wherein the second sublayer comprises one of CoCr$_x$, CoV$_x$, CoTi$_x$, CoCr$_x$V$_y$, CoCr$_x$Ti$_y$, CoV$_x$Ti$_y$, or CoCr$_x$V$_y$Ti$_z$, and wherein the value of each of x, y, and z is a positive number.

4. The spintronic device of claim 1, wherein each of the first sublayers has a first thickness between about 0.4 nm to about 0.8 nm, and wherein each of the second sublayers has a second thickness between about 0.3 nm to about 0.6 nm.

5. The spintronic device of claim 1, wherein the multilayer structure is a free layer, a pinned layer, or a field generating layer.

6. A magnetic media drive comprising the spintronic device of claim 1.

7. A magnetoresistive random access memory device comprising the spintronic device of claim 1.

8. A magnetic sensor comprising the spintronic device of claim 1.

9. A magnetic recording head comprising the spintronic device of claim 1.

10. A spintronic device, comprising:
    a substrate;
    a multilayer structure having a negative spin polarization and a negative anisotropic field disposed over the substrate, the multilayer structure comprising a plurality of alternating first layers and second layers, wherein each of the first layers comprises Fe and one or more of Cr, V, and Ti, and each of the second layers comprises Co, wherein each of the first layers has a first thickness greater than or equal to a second thickness of each of the second layers; and
    a cap layer disposed over the multilayer structure.

11. The spintronic device of claim 10, wherein the multilayer structure is a free layer, a pinned layer, or a field generating layer, and wherein each of the first layers has a first thickness between about 0.4 nm to about 0.8 nm and each of the second layers has a second thickness between about 0.3 nm to about 0.6 nm.

12. The spintronic device of claim 10, wherein the first layers each comprises one of FeCr$_x$, FeV$_x$, FeTi$_x$, FeCr$_x$V$_y$, FeCr$_x$Ti$_y$, FeV$_x$Ti$_y$, or FeCr$_x$V$_y$Ti$_z$, wherein each of x, y, and z is a number between 1 and 46.

13. The spintronic device of claim 10, wherein the second layers each comprises one of CoCr$_x$, CoV$_x$, CoTi$_x$, CoCr$_x$V$_y$, CoCr$_x$Ti$_y$, CoV$_x$Ti$_y$, or CoCr$_x$V$_y$Ti$_z$, wherein each of x, y, and z is a number between 1 and 46.

14. The spintronic device of claim 10, wherein the cap layer is an additional first layer comprising FeCr$_x$, FeV$_x$, FeTi$_x$, FeCr$_x$V$_y$, FeCr$_x$Ti$_y$, FeV$_x$Ti$_y$, or FeCr$_x$V$_y$Ti$_z$ having the first thickness.

15. A magnetic media drive comprising the spintronic device of claim 10.

16. A magnetoresistive random access memory device comprising the spintronic device of claim 10.

17. A magnetic sensor comprising the spintronic device of claim 10.

18. A magnetic recording head comprising the spintronic device of claim 10.

19. A spintronic device, comprising:
    a multilayer structure having a negative spin polarization and a negative anisotropic field, the multilayer structure comprising a plurality of alternating first layers and second layers, wherein each of the first layers comprises at least one of FeCr$_x$, FeV$_x$, FeTi$_x$, FeCr$_x$V$_y$, FeCr$_x$Ti$_y$, FeV$_x$Ti$_y$, and FeCr$_x$V$_y$Ti$_z$, where each of x, y, and z is a positive number, and each of the second layers comprising Co, wherein each of the first layers has a first thickness between about 0.4 nm to about 0.8 nm and each of the second layers has a second thickness between about 0.3 nm to about 0.6 nm; and
    one or more layers disposed over the multilayer structure.

20. The spintronic device of claim 19, wherein the one or more layers comprise a cap layer disposed in contact with the multilayer structure, the cap layer being an additional first layer comprising $FeCr_x$, $FeV_x$, $FeTi_x$, $FeCr_xV_y$, $FeCr_xTi_y$, $FeV_xTi_y$, or $FeCr_xV_yTi_z$ having the first thickness.

21. The spintronic device of claim 19, wherein the multilayer structure is a free layer, a pinned layer, or a field generating layer, and wherein the negative anisotropic field of the multilayer structure is between about −0.5 T to about −0.8 T, and an effective magnetization of the multilayer structure is between about 2.4 T to about 2.8 T.

22. The spintronic device of claim 19, wherein each of the second layers further comprises one or more of Cr, V, and Ti.

23. A magnetic media drive comprising the spintronic device of claim 19.

24. A magnetoresistive random access memory device comprising the spintronic device of claim 19.

25. A magnetic sensor comprising the spintronic device of claim 19.

26. A magnetic recording head comprising the spintronic device of claim 19.

\* \* \* \* \*